(12) United States Patent
Izuka et al.

(10) Patent No.: US 8,692,279 B2
(45) Date of Patent: Apr. 8, 2014

(54) SEMICONDUCTOR LIGHT EMITTING DEVICE

(75) Inventors: Miyuki Izuka, Kanagawa-ken (JP);
Yosuke Akimoto, Kanagawa-ken (JP);
Akihiro Kojima, Kanagawa-ken (JP);
Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 424 days.

(21) Appl. No.: 13/052,248

(22) Filed: Mar. 21, 2011

(65) Prior Publication Data

US 2011/0297997 A1     Dec. 8, 2011

(30) Foreign Application Priority Data

Jun. 7, 2010   (JP) ................................. 2010-130509

(51) Int. Cl.
*H01L 33/00*   (2010.01)
(52) U.S. Cl.
USPC ...................... 257/99; 257/91; 257/E33.065
(58) Field of Classification Search
USPC .................................................... 257/81, 88
See application file for complete search history.

(56) References Cited

U.S. PATENT DOCUMENTS

| | | | | |
|---|---|---|---|---|
| 5,696,389 | A * | 12/1997 | Ishikawa et al. | 257/99 |
| 6,307,218 | B1 | 10/2001 | Steigerwald et al. | |
| 8,154,037 | B2 * | 4/2012 | Kadotani et al. | 257/97 |
| 8,399,903 | B2 * | 3/2013 | Salam | 257/99 |
| 2004/0012958 | A1 | 1/2004 | Hashimoto et al. | |
| 2005/0194605 | A1 * | 9/2005 | Shelton et al. | 257/99 |
| 2006/0113548 | A1 * | 6/2006 | Chen et al. | 257/79 |
| 2006/0169993 | A1 * | 8/2006 | Fan et al. | 257/88 |
| 2006/0237738 | A1 * | 10/2006 | Salam | 257/98 |
| 2006/0261364 | A1 | 11/2006 | Suehiro et al. | |
| 2007/0176193 | A1 | 8/2007 | Nagai | |
| 2010/0072489 | A1 * | 3/2010 | Mclaurin et al. | 257/88 |
| 2010/0140640 | A1 | 6/2010 | Shimokawa et al. | |
| 2010/0148198 | A1 * | 6/2010 | Sugizaki et al. | 257/98 |
| 2011/0204396 | A1 | 8/2011 | Akimoto et al. | |
| 2011/0233585 | A1 * | 9/2011 | Kojima et al. | 257/98 |
| 2011/0233586 | A1 * | 9/2011 | Kojima et al. | 257/98 |
| 2011/0284910 | A1 | 11/2011 | Iduka et al. | |
| 2012/0193651 | A1 * | 8/2012 | Edmond et al. | 257/88 |

FOREIGN PATENT DOCUMENTS

| | | |
|---|---|---|
| DE | 10 2007 019 776 A1 | 10/2008 |
| DE | 10 2007 062 046 A | 6/2009 |
| DE | 10 2007 062 046 A1 | 6/2009 |

(Continued)

OTHER PUBLICATIONS

Chiou et al, Investigation of Electrode Pattern Design for Nitride-based Light Emitting Diodes, 2007.
Ochiai et al, Optimization of Electrode Configuration in Large GaInN light-emitting diodes, Phys. Status C 6, No. 6, pp. 1416-1419, 2009.

(Continued)

*Primary Examiner* — Jarrett Stark
(74) *Attorney, Agent, or Firm* — White & Case LLP

(57) ABSTRACT

According to one embodiment, a semiconductor light emitting device includes a semiconductor layer, a first electrode, a second electrode, a first insulating layer, a first interconnect layer, a second interconnect layer, a first metal pillar, a second metal pillar, and a second insulating layer. The semiconductor layer includes a first major surface, a second major surface opposite to the first major surface, and a light emitting layer. The first electrode is provided on a region including the light emitting layer on the second major surface. The second electrode is provided on the second major surface and interposed in the first electrode in a planar view.

20 Claims, 11 Drawing Sheets

(56) References Cited

FOREIGN PATENT DOCUMENTS

| | | |
|---|---|---|
| GB | 2 343 994 A | 5/2000 |
| JP | 05-21845 | 1/1993 |
| JP | 2000-244012 | 9/2000 |
| JP | 2003-524295 A | 8/2003 |
| JP | 2007-288097 A | 1/2007 |
| JP | 2007-288097 A | 11/2007 |
| WO | 2009/007886 A1 | 1/2001 |
| WO | 01 41223 A1 | 6/2001 |
| WO | 2006030678 A2 | 3/2006 |
| WO | 2009/007886 A1 | 1/2009 |

OTHER PUBLICATIONS

Japanese Office Action issued on Apr. 22, 2013 in counterpart Japanese Patent Application No. 2010-130509, and English translation thereof.

European Official Minutes for Application No. 1159169.9-2222 issued on Oct. 16, 2012.

Extended European Search Report for Application No. 1159169.9-2222/2393132 issued on Nov. 22, 2011.

Chinese Office Action issued on Jun. 5, 2013 in the counterpart Chinese patent explanation No. 201110070617.7, an English translation thereof.

* cited by examiner ved on a face of the first interconnect layer on a side opposite to the first electrode. The second metal pillar is provided on a face of the second interconnect layer on a side opposite to the second electrode. The second insulating layer is provided between a side face of the first metal pillar and a side face of the second metal pillar.

SEMICONDUCTOR LIGHT EMITTING DEVICE

CROSS-REFERENCE TO RELATED APPLICATION

This application is based upon and claims the benefit of priority from Japanese Patent Application No. 2010-130509, filed on Jun. 7, 2010; the entire contents of which are incorporated herein by reference.

FIELD

Embodiments described herein relate generally to a semiconductor light emitting device.

BACKGROUND

In a known structure, an n-side electrode and a p-side electrode are formed on one major surface side of the semiconductor layer. Because electrodes do not interfere with light extraction from a light emission surface in such a structure, there is a lot of flexibility of configurations and layouts of the electrodes. Appropriate design is needed because configurations and layouts of the electrodes affect electrical characteristics and the luminous efficiency.

DETAILED DESCRIPTION

Figure 1:
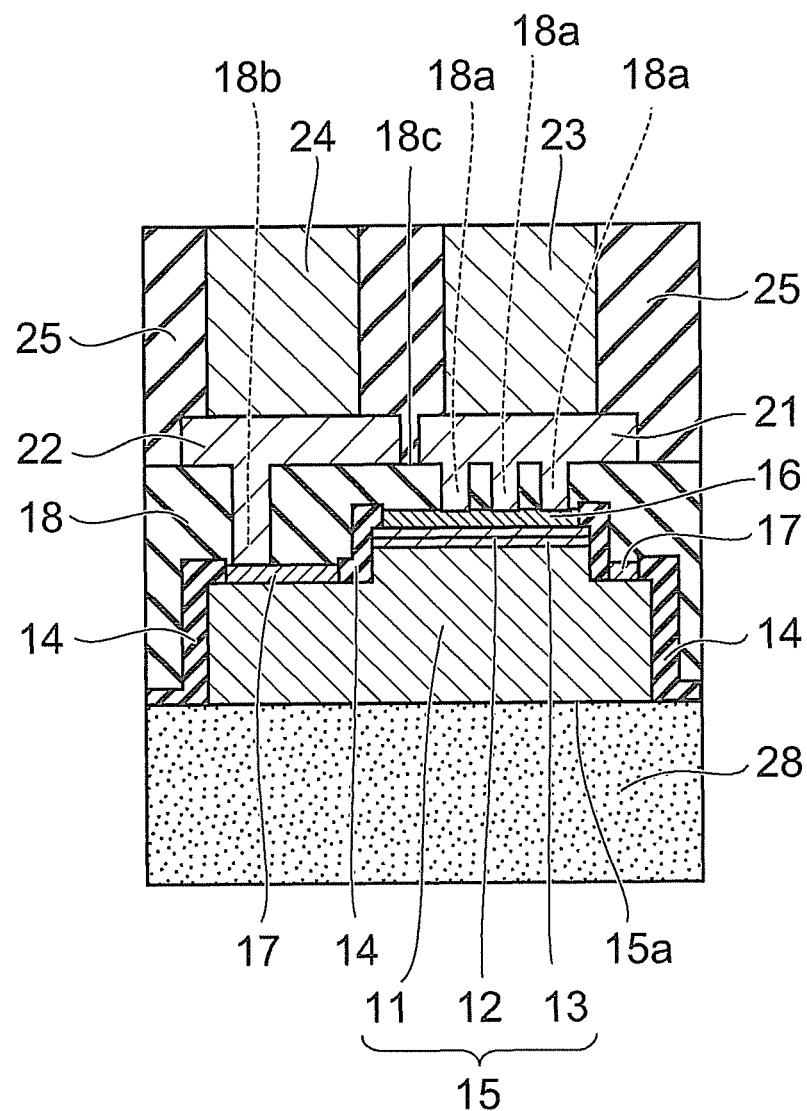
FIG. 1 is a schematic cross-sectional view of a semiconductor light emitting device of an embodiment.

According to one embodiment, a semiconductor light emitting device includes a semiconductor layer, a first electrode, a second electrode, a first insulating layer, a first interconnect layer, a second interconnect layer, a first metal pillar, a second metal pillar, and a second insulating layer. The semiconductor layer includes a first major surface, a second major surface opposite to the first major surface, and a light emitting layer. The first electrode is provided on a region including the light emitting layer on the second major surface. The second electrode is provided on the second major surface and interposed in the first electrode in a planar view. The first insulating layer is provided on the second major surface side of the semiconductor layer. The first interconnect layer is provided on the first insulating layer on a side opposite to the semiconductor layer. The first interconnect layer is provided in a first opening formed in the first insulating layer reaching the first electrode. The first interconnect layer is connected to the first electrode. The second interconnect layer is provided on the first insulating layer on the side opposite to the semiconductor layer. The second interconnect layer is provided in a second opening formed in the first insulating layer reaching the second electrode. The second interconnect layer is connected to the second electrode. The first metal pillar is pro- Exemplary embodiments will now be described with reference to the drawings. Similar components in the drawings are marked with like reference numerals. The drawings showing processes illustrate a part of regions in a wafer state.

FIG. 1 is a schematic cross-sectional view of a semiconductor light emitting device of an embodiment.

Figure 2A:
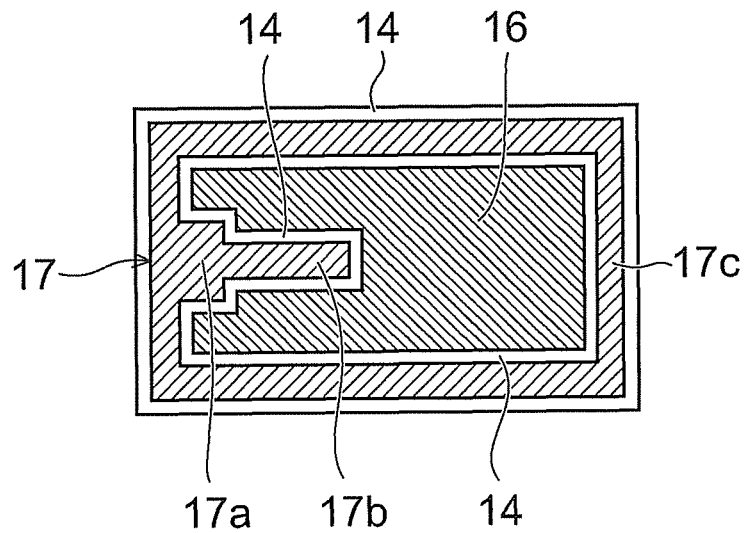
FIGS. 2A and 2B are schematic plan views illustrating the configuration and layout of components provided on a second major surface side of the semiconductor light emitting device of the embodiment.

FIG. 2A is a schematic plan view illustrating the configuration and a layout of a p-side electrode 16 and an n-side electrode 17 of the semiconductor light emitting device of the embodiment.

Figure 2B:
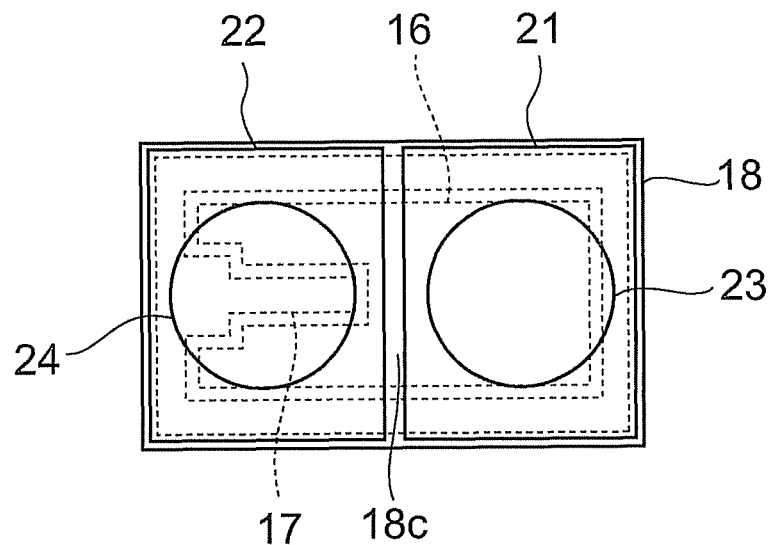

FIG. 2B is a schematic plan view illustrating the configuration and a layout of a p-side interconnect layer 21, an n-side interconnect layer 22, a p-side metal pillar 23 and an n-side metal pillar 24 of the semiconductor light emitting device of the embodiment.

The light emitting device of the embodiment includes a semiconductor layer 15. The semiconductor layer 15 includes a first major surface 15a and a second major surface formed on a side opposite to the first major surface 15a. The electrodes 16 and 17, the interconnect layers 21 and 22, the metal pillars 23 and 24, and resin layers 18 and 25 are provided on the second major surface side. Light is mainly extracted from the first major surface 15a.

The semiconductor layer 15 includes a first semiconductor layer 11 and a second semiconductor layer 13. The first semiconductor layer 11 is, for example, an n-type GaN layer. The first semiconductor layer 11 functions as a lateral current path. However, the conductivity type of the first semiconductor layer 11 is not limited to the n-type and the conductivity type may be a p-type. The second semiconductor layer 13 includes a stacked configuration in which a light emitting layer (an active layer) 12 is interposed between a p-type layer and an n-type layer.

The second major surface side of the semiconductor layer 15 is patterned into a recessed and protruding configuration. A protruding portion, which protrudes toward a side opposite to the first major surface 15a, includes the light emitting layer 12. The first semiconductor layer 11 is recessed toward the first major surface 15a with respect to the protruding portion. The first semiconductor layer 11 is provided on the sides and peripheries of the protruding portion and this portion does not include the light emitting layer 12 and is a non-light emitting region.

The p-side electrode 16 is provided as a first electrode on the surface, which is the surface of the protruding portion, of the second semiconductor layer 13. The p-side electrode 16 is provided on the light emitting region which includes the light emitting layer 12. The n-side electrode 17 is provided as a second electrode on the surface of the first semiconductor layer 11 which is the non-light emitting region.

A surface area of the p-side electrode 16 is greater than a surface area of the n-side electrode 17 in one chip (semiconductor layer 15), as shown in FIG. 2A. The light emitting region on which the p-side electrode 16 is provided has the greater surface area than the non-light emitting region on which the n-side electrode 17 is provided, and thus the luminance can be increased.

As illustrated in FIG. 2A, the n-side electrode 17 includes a first portion 17a and a second portion 17b, which are interposed in the p-side electrode 16 in a planar view taken of the second major surface side. The first portion 17a is wider than the second portion 17b in the vertical direction of FIG. 2A.

Further, the n-side electrode 17 includes a third portion 17c, which encloses the peripheries of the p-side electrode 16 in the planar view taken of the second major surface side. The third portion 17c, the first portion 17a and the second portion 17b continuously enclose the p-side electrode 16, that is, continuously encloses the protruding portion (the light emitting region) which includes the light emitting layer 12. The first portion 17a, the second portion 17b, and the third portion 17c of the n-side electrode 17 are connected as a unit.

The first portion 17a and the second portion 17b protrude inside the third portion 17c. The p-side electrode 16 sandwiches the first portion 17a and the second portion 17b, which protrude from the third portion 17c.

An insulating layer 14 is provided between the n-side electrode 17 and the p-side electrode 16. A difference in level (step) is formed between the light emitting region having the p-side electrode 16 (the protruding portion) and the non-light emitting region having the n-side electrode 17. The difference in level is covered with the insulating layer 14.

The insulating layer 14 covers the side faces of the semiconductor layer 15 and a part of the second major surface. The insulating layer 14 does not cover the p-side electrode 16 and the n-side electrode 17. Further, an insulating layer 18 is provided so as to cover the insulating layer 14, the p-side electrode 16, and the n-side electrode 17. The insulating layer 14 is, for example, a silicon oxide. The insulating layer 18 is, for example, a resin such as polyimide having good patternability in fine patterns. Alternatively, a silicon oxide may be used as the insulating layer 18.

The p-side interconnect layer 21 as a first interconnect layer and the n-side interconnect layer 22 as the second interconnect layer are provided on a surface 18c of the insulating layer 18 on a side opposite to the semiconductor layer 15. The p-side interconnect layer 21 is also provided in a first opening 18a formed in the insulating layer 18 to reach the p-side electrode 16, and is connected to the p-side electrode 16. The n-side interconnect layer 22 is also provided in a second opening 18b formed in the insulating layer 18 to reach the n-side electrode 17, and is connected to the n-side electrode 17.

The p-side metal pillar 23 is provided as a first metal pillar on a face of the p-side interconnect layer 21 on a side opposite to the p-side electrode 16. The n-side metal pillar 24 is provided as a second metal pillar on a face of the n-side interconnect layer 22 on a side opposite to the n-side electrode 17.

The peripheries of the p-side metal pillar 23, the peripheries of the n-side metal pillar 24, the p-side interconnect layer 21, and the n-side interconnect layer 22 are covered, for example, with a resin layer 25 as a second insulating layer. Each of the mounting surfaces (upper faces in FIG. 1) of the p-side metal pillar 23 and the n-side metal pillar 24 is exposed from the resin layer 25. The second insulating layer and the first insulating layer (the insulating layer 18) may be formed from the same material.

The surface area of the n-side interconnect layer 22, which is connected to the n-side electrode 17 provided on the non-light emitting region not including the light emitting layer 12 of the semiconductor layer 15, is greater at a side opposite to the n-side electrode 17 than at a side of the n-side electrode 17. A contact area between the n-side interconnect layer 22 and the n-side metal pillar 24 is greater than a contact area between the n-side interconnect layer 22 and the n-side electrode 17. A contact area between the p-side interconnect layer 21 and the p-side metal pillar 23 is greater than a contact area between the p-side interconnect layer 21 and the p-side metal electrode 16. Alternatively, the contact area between the p-side interconnect layer 21 and the p-side metal pillar 23 may be smaller than the contact area between the p-side interconnect layer 21 and the p-side electrode 16. A portion of the n-side interconnect layer 22 extends on the surface 18c of the insulating layer 18 to a position facing with the light emitting layer 12.

Thereby, an enlarged extracted electrode can be formed from the n-side electrode 17 provided on a small area of the portion not including the light emitting layer 12 of the semiconductor layer 15 via the n-side interconnect layer 22, while keeping a high light output with the larger light emitting layer 12.

The first semiconductor layer 11 is electrically connected to the n-side metal pillar 24 via the n-side electrode 17 and the n-side interconnect layer 22. The second semiconductor layer 13 is electrically connected to the p-side metal pillar 23 via the p-side electrode 16 and the p-side interconnect layer 21.

A surface treatment film (for example, a electroless plating film such as Ni, Au, pre-coated solder, and so on) with the aim of corrosion control, etc., is formed as necessary on each of mounting surfaces of the p-side metal pillar 23 and the n-side metal pillar 24.

The mounting surfaces of the p-side metal pillar 23 and the n-side metal pillar 24 can be bonded to circuit formed on a mounting board or a circuit board via ball-shaped or bump-shaped external terminals made of, for example, solder or other metals. Thereby, electric power can be supplied to the semiconductor light emitting device.

The thickness of each of the n-side metal pillar 24 and the p-side metal pillar 25 (the thickness in the vertical direction of FIG. 1) is thicker than the thickness of a stacked body including the semiconductor layer 15, the n-side electrode 17, the p-side electrode 16, the insulating layer 14 and 18, the n-side interconnect layer 22, and the p-side interconnect layer 21. The aspect ratios (the ratio of the thickness to the planar size) of the metal pillars 23 and 24 are not limited to being 1 or more and the ratios may be less than 1. The thicknesses of the metal pillars 23 and 24 may be smaller than the planar sizes thereof.

According to the structure of this embodiment, it is possible to maintain the mechanical strength by making the n-side metal pillar 24, the p-side metal pillar 23, and the resin layer 25 thick even if the semiconductor layer 15 is thin. In the case of mounting on a mounting board, the n-side metal pillar 24 and the p-side metal pillar 23 can absorb and mitigate the stress applied to the semiconductor layer 15 via the external terminals.

The materials of the n-side interconnect layer 22, the p-side interconnect layer 21, the n-side metal pillar 24, and the p-side metal pillar 23 may include copper, gold, nickel, silver, etc. Thereof, copper is preferable because copper provides good thermal conductivity, high migration resistance, and excellent adhesion with insulating material.

Patterning to make the first opening 18a and the second opening 18b is performed on the insulating layer 18. Therefore, resin such as, for example, polyimide having excellent patternability in ultra-fine patterns is preferable as the insulating layer 18.

It is preferable to use resin formed thickly at low cost and suitable to reinforce the n-side metal pillar 24 and the p-side metal pillar 23 as the resin layer 25. Examples of such a resin layer 25 may include, for example, epoxy resin, silicone resin, fluorocarbon resin, etc.

A fluorescent layer 28 is provided on the first major surface 15a of the semiconductor layer 15. The fluorescent layer 28 is capable of absorbing light from the light emitting layer 12 and emitting wavelength-converted light. Therefore, it is possible to emit mixed light of the light from the light emitting layer 12 and the wavelength-converted light of the fluorescent layer 28. In the case where, for example, the light emitting layer 12 is nitride-based, it is possible to obtain white light, lamp light, etc., as mixed-color light of blue light from the light emitting layer 12 and yellow light from, for example, the wavelength-converted light of a yellow fluorescent layer 28. The fluorescent layer 28 may have a configuration including multiple types of phosphor materials (e.g., a red phosphor material and a green phosphor material).

The light emitted from the light emitting layer 12 mainly travels through the first semiconductor layer 11, the first major surface 15a, and the fluorescent layer 28 to be emitted externally.

Because electrodes are not provided on the first major surface 15a which is a light emission surface, the electrodes do not interfere with light extraction from the light emission surface, and the high luminance can be obtained. The p-side electrode 16 and the n-side electrode 17 are provided on the second major surface on the side opposite to the first major surface 15a. Because the p-side electrode 16 and the n-side electrode 17 are not provided on the light emission surface, there is a lot of flexibility of configurations and layouts.

The electrodes are designed so as to increase the luminous efficiency and to obtain higher luminance in this embodiment. That is, as shown in FIG. 2A, the first portion 17a and the second portion 17b in the n-side electrode 17 extend from an outer edge side to an inner side of a chip, and the portions 17a and 17b are interposed in the p-side electrode 16. The layout like this ensures the longer length of the interface where the p-side electrode 16 and n-side electrode 17 face each other in a planar view. As a result, surface variations of the current density and the luminance of the light emitting layer 12 can be reduced, and the semiconductor light emitting device with high efficiency can be provided.

Further, in this embodiment, the n-side electrode 17 includes the third portion 17c, which encloses the circumference of the p-side electrode 16. Because the n-side electrode 17 encloses the circumference of the p-side electrode 16, the length of the interface between the n-side electrode 17 and the p-side electrode 16 can be increased, and the current injection unbiased with respect to the light emission surface and more uniformed can be obtained. At a result, efficiency and the luminance can be further improved.

The enhancement of the length of the interface between the p-side electrode 16 and the n-side electrode 17 also suppresses local concentration of electric field and increases the reliability.

The surface area of the n-side electrode 17 provided on the non-light emitting region is made smaller than the surface area of the p-side electrode 16 so as to obtain a larger light emitting region and to increase the luminance. It is desirable that the n-side electrode 17 is formed in an elongate shape so as to increase the length of the interface between the p-side electrode 16 and the n-side electrode 17 as described above, while the enhancement of the surface area of the n-side electrode 17 is suppressed. In the design illustrated in FIG. 2A, the second portion 17b and third portion 17c of the n-side electrode 17 are illustratively formed in a linear-shape with a width of about several micrometers to several dozen-micrometers.

Wire bonding to a narrow width and long length electrode becomes difficult and may cause decrease of the productivity and the reliability.

However, wire bonding is not performed to electrodes in this embodiment. That is, the n-side interconnect layer 22 connected to the n-side electrode 17 is provided on the surface 18c of the insulating layer 18 provided on the second major surface side so as to cover the electrodes. In the layout illustrated in FIG. 2B, the n-side interconnect layer 22 covers approximately half of a chip area and extends on the surface 18c of the insulating layer 18. In other words, a structure is provided in which the n-side electrode is extracted from the side opposite to the light emission surface to expand more widely.

Then, the n-side metal pillar 24 is provided on the n-side interconnect layer 22. A voltage is supplied through the n-side metal pillar 24 and n-side interconnect layer 22 formed wider than the linear n-side electrode 17. This results in decrease of an electrical resistance of the n-side. Because what is bonded to mounting board is not the n-side electrode 17 but the n-side metal pillar 24 with a wider width, mounting can be easy. The n-side metal pillar 24 and the p-side metal pillar 23 are bonded to circuit formed on the mounting board via a metal such as, for example, solder.

Further, because a structure is provided in which electrodes are connected to the greater surface areas of the metals (the interconnect layers and the metal pillars) than that of wire bonding, radiativity of heat is high. For example, in the case where copper or aluminum is used as the materials of the interconnect layers 21 and 22, the metal pillars 23 and 24, high radiativity of heat can be obtained.

Further, most of the second major surface is covered with the p-side electrode 16 and the n-side electrode 17 formed of the metal which has reflection for the light emitted from the light emitting layer 12. Therefore, the p-side electrode 16 and the n-side electrode 17 function also as reflective material, extraction efficiency of the light from the first major surface 15a can be increased, and the luminance can be increased. For example, in the case where the material of the p-side electrode 16 and the n-side electrode 17 includes silver (Ag), high reflectance can be obtained.

The first opening 18a which pierces the insulating, layer 18 and reaches the p-side electrode 16 may be at least one so as to connect electrically the p-side electrode 16 and the p-side interconnect layer 21. However, the amount of heat generation of the p-side electrode 16 provided on the light emitting region including the light emitting layer 12 is greater than that of the n-side electrode 17 provided on the non-light emitting region not including the light emitting layer 12. Then, a plurality of the first openings 18a are formed in this embodiment. Therefore, the p-side interconnect layer 21 and the p-side electrode 16 are connected via the plurality of the first openings 18a, each of which is filled with a portion of the p-side interconnect layer 21. As a result, a plurality of heat paths from the p-side electrode 16 to the p-side interconnect layer 21 are ensured, radiativity of heat can be enhanced, and reliability and a lifetime can be increased.

The second opening 18b which connects the n-side electrode 17 and the n-side interconnect layer 22 may be just one because the amount of heat generation of the n-side electrode 17 is smaller than that of the p-side electrode 16. Therefore, the connecting area of the p-side electrode 16 and the p-side interconnect layer 21 via the first openings 18a is greater than that of the n-side electrode 17 and the n-side interconnect layer 22 via the second opening 18b. The n-side electrode 17 and the n-side interconnect layer 22 may be connected via a plurality of the second openings 18b.

The light emitting region on which the p-side electrode 16 is provided, protrudes more to the interconnect layers side than the portion on which the n-side electrode 17 is provided. Therefore, the distance between the p-side electrode 16 and the p-side interconnect layer 21 facing each other is smaller than the distance between the n-side electrode 17 and n-side interconnect layer 22 facing each other. In other words, the depth of the first opening 18a, which extends from the surface 18c of the insulating layer 18 to reach the p-side electrode 16, is shallower than that of the second opening 18b, which extends from the surface 18c of the insulating layer 18 to reach the n-side electrode 17. Consequently, the heat path of the p-side via the first opening 18a is shorter than that of the n-side via the second opening 18b and has high radiativity of heat.

As described above, the n-side electrode 17 is formed in the elongate linear shape. In view of misalignment of the n-side electrode 17 and the second opening 18b by lithography, the first portion 17a, which is wider than the linear second portion 17b and the third portion 17c, is provided in the n-side electrode 17 in this embodiment. The first portion 17a is formed in, for example, a square several dozen micrometers on a side. The second opening 18b is formed on the first portion 17a, and the n-side interconnect layer 22 is connected to the first portion 17a. Herewith, the n-side interconnect layer 22 can be reliably connected to the n-side electrode 17.

A method for manufacturing the semiconductor light emitting device of the embodiment will now be described with reference to FIG. 3A to FIG. 6B.

Figure 3A:
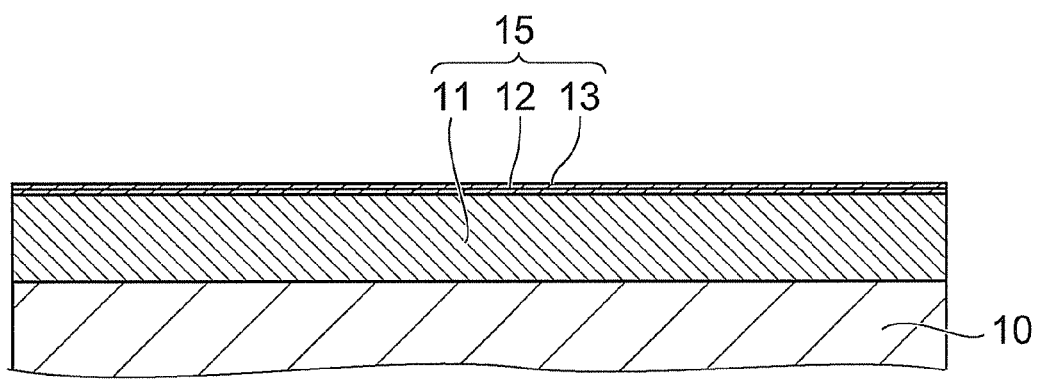
FIGS. 3A to 6B are schematic cross-sectional views illustrating a method for manufacturing the semiconductor light emitting device of the embodiment.

As illustrated in FIG. 3A, the first semiconductor layer 11 is grown on the major surface of a substrate 10, and the second semiconductor layer 13 including the light emitting layer 12 are grown thereupon. In the case where the semiconductor layer 15 (the first semiconductor layer 11, the light emitting layer 12 and the second semiconductor layer 13) are, for example, made of nitride semiconductors, the semiconductor layer 15 can be formed by, for example, crystal growth on a sapphire substrate.

Figure 3B:
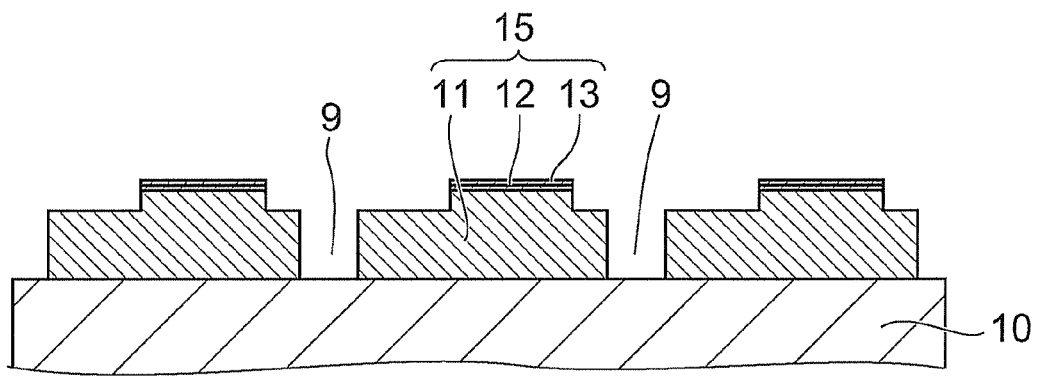

Then, as illustrated in FIG. 3B, a separating trench 9 is formed to pierce the semiconductor layer 15 and reach the substrate 10 by, for example, Reactive Ion Etching (RIE) using a not-illustrated resist as a mask. The separating trench 9 is formed, for example, in a lattice configuration on the substrate 10 to multiply separate the semiconductor layer 15.

A portion of the second semiconductor layer 13 including the light emitting layer 12 is removed by, for example, RIE using the not-illustrated resist to expose a portion of the first semiconductor layer 11. Thereby, the light emitting region is formed on the second major surface side of the semiconductor layer 15 and positioned relatively in the upper level as viewed from the substrate 10, and the non-light emitting region is formed on the second major surface side of the semiconductor layer 15 and positioned more in the lower level on the substrate 10 side than the light emitting region. The light emitting region includes the light emitting layer 12, and the non-light emitting region does not include the light emitting layer 12.

Figure 4A:
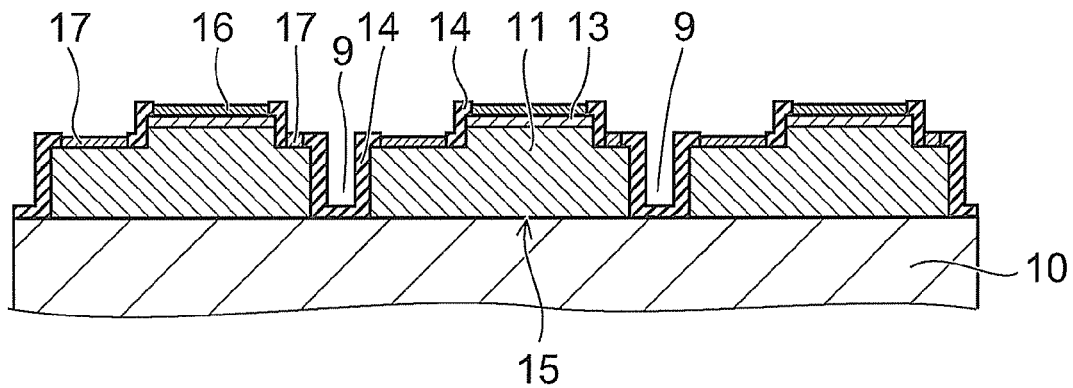

The major surface of the substrate, the side faces of the semiconductor layer 15 and the second major surface are covered with an insulating layer 14 shown in FIG. 4A. Then, the insulating layer 14 is selectively removed, the p-side electrode 16 is formed on the surface of the light emitting region (the surface of the second semiconductor layer 13), and the n-side electrode 17 is formed on the surface of the non-light emitting region (the surface of the first semiconductor layer 11). Either of the p-side electrode 16 and the n-side electrode 17 may be formed prior to the other, or the p-side electrode 16 and the n-side electrode 17 may be formed simultaneously from the same material.

Figure 4B:
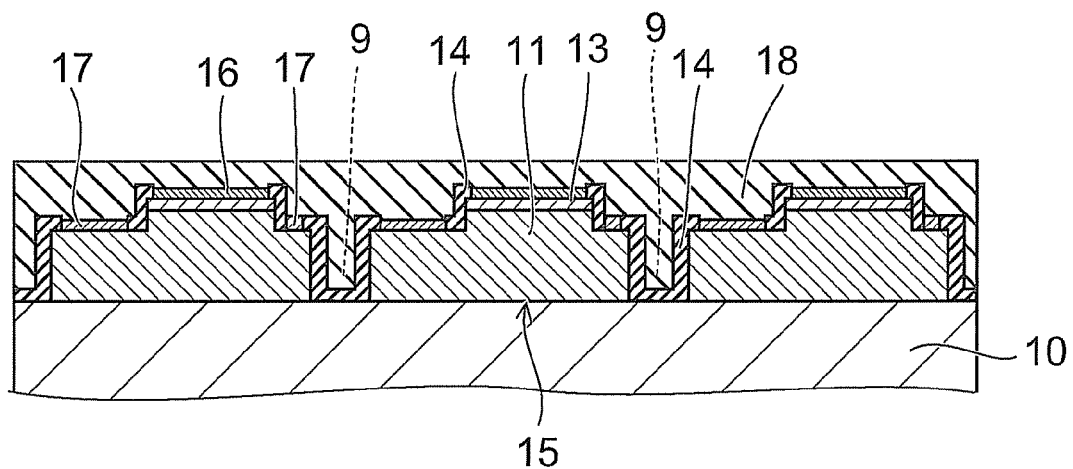

Then, all of the exposed portions of the substrate 10 are covered with the insulating layer 18 shown in FIG. 4B. The insulating layer 18 is filled in the separating trench 9.

Figure 5A:
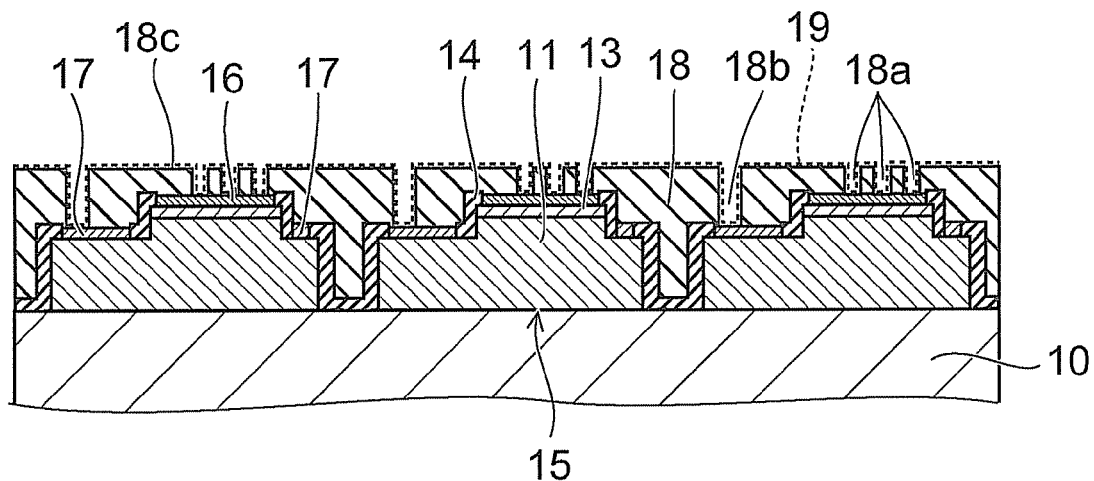

Thereafter, the insulating layer 18 is patterned by, for example, wet etching to make the first opening 18a and the second opening 18b in the insulating layer 18 as illustrated in FIG. 5A. A plurality of the first openings 18a is formed, and each of the first openings 18a reaches the p-side electrode 16. The second opening 18b reaches the n-side electrode 17. The depth from the surface 18c of the insulating layer 18 is deeper at the second opening 18b than at the first opening 18a.

Then, a continuous seed metal 19 (shown by a broken line in FIG. 5A) is formed on the surface 18c of the insulating layer 18 and on the inner faces of the first opening 18a and the second opening 18b, and after forming selectively a not-illustrated plating resist on the seed metal 19, Cu plating is performed using the seed metal 19 as a current path.

Figure 5B:
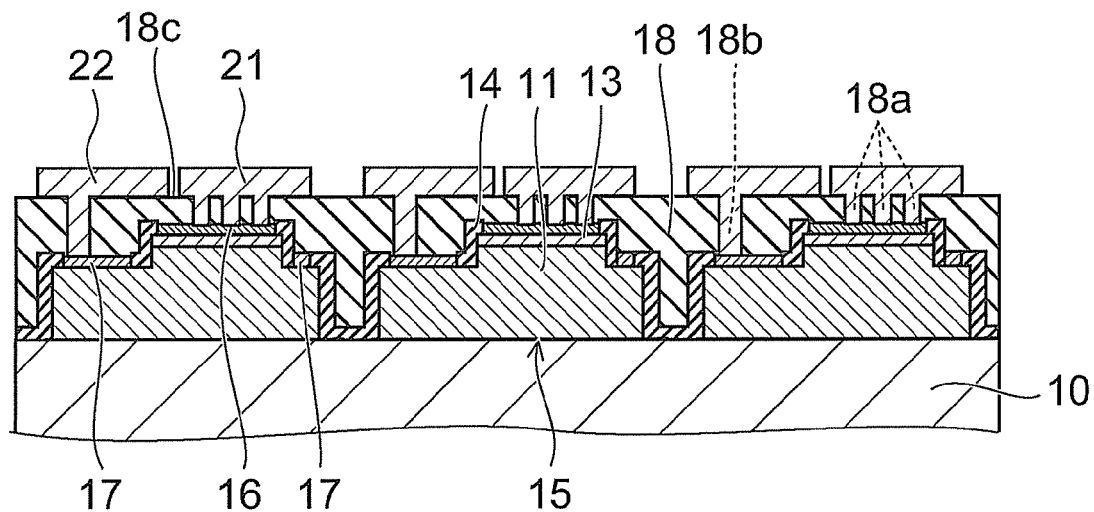

Thereby, as illustrated in FIG. 5B, the p-side interconnect layer 21 and the n-side interconnect layer 22 are formed selectively on the surface 18c of the insulating layer 18. The p-side interconnect layer 21 is formed also in the first opening 18a to be connected to the p-side electrode 16. The n-side interconnect layer 22 is formed also in the second opening 18b to be connected to the n-side electrode 17. The p-side interconnect layer 21 and the n-side interconnect layer 22 are formed simultaneously from copper material by plating, or the p-side interconnect layer 21 and the n-side interconnect layer 23 are not necessarily formed simultaneously. Either of the p-side interconnect layer 21 and the n-side interconnect layer 22 may be formed prior to the other.

The face of the n-side interconnect layer 22 on the side opposite to the n-side electrode 17 is formed on the surface 18c of the insulating layer 18 with a pad-shape to be a greater area than that on the side connecting to the n-side electrode 17. Similarly, the face of the p-side interconnect layer 21 on the side opposite to the p-side electrode 16 is formed on the surface 18c of the insulating layer 18 with a pad-shape to be a greater area than that on the side connecting to the p-side electrode 16.

Subsequently, another plating resist (not illustrated) is formed selectively on the insulating layer 18 for forming the metal pillars, and Cu plating is performed using the seed metal 19 described above as a current path.

Figure 6A:
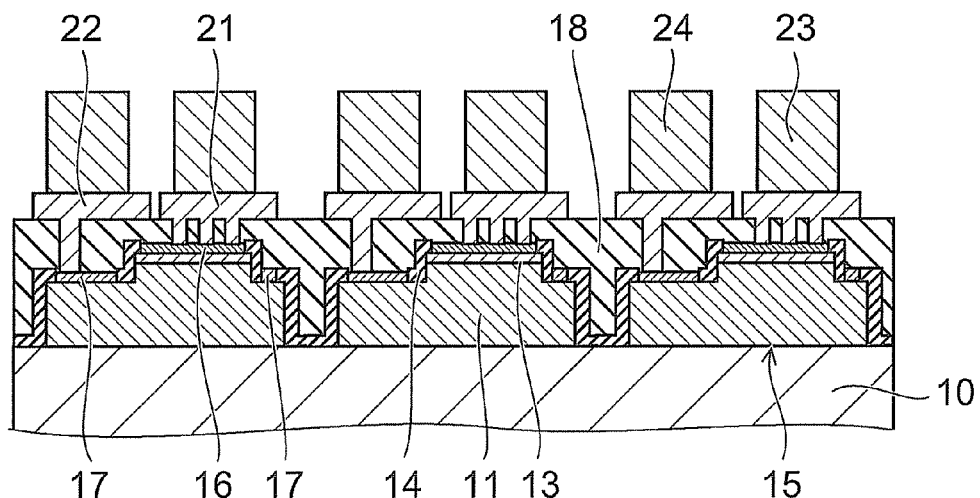

Thereby, as illustrated in FIG. 6A, the p-side metal pillar 23 is formed on the p-side interconnect layer 21, and the n-side metal pillar 24 is formed on the n-side interconnect layer 22. The p-side metal pillar 23 and the n-side metal pillar 24 are formed simultaneously from, for example, copper material by plating, or the p-side metal pillar 23 and the n-side metal pillar 24 are not necessarily formed simultaneously. Either of the p-side metal pillar 23 and the n-side metal pillar 24 may be formed prior to the other.

After this plating, the p-side interconnect layer 21, n-side interconnect layer 22, p-side metal pillar 23 and n-side metal pillar 24 are used as a mask to perform wet etching the seed metal 19 exposed on the surface 18c of the insulating layer 18. Thereby, the electrical connection between the p-side interconnect layer 21 and the n-side interconnect layer 22 via the seed metal 19 is divided.

Figure 6B:
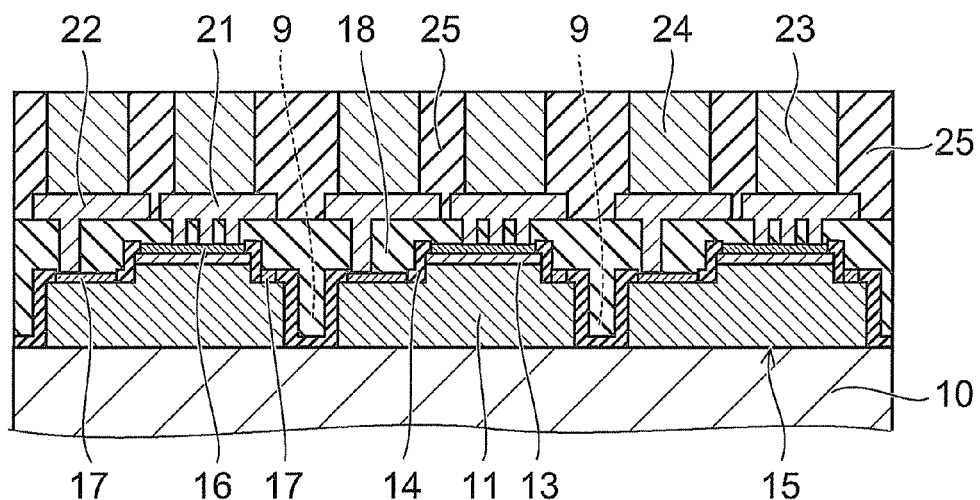

Then, as illustrated in FIG. 6B, a resin layer 25 is formed on the insulating layer 18. The resin layer 25 covers the p-side interconnect layer 21, the n-side interconnect layer 22, the p-side metal pillar 23, and the n-side metal pillar 24. The resin layer 25 is filled in the portion between the side faces of the p-side metal pillar 23 and the side faces of the n-side metal pillar 24, and in the portion between the p-side interconnect layer 21 and the n-side interconnect layer 22.

Subsequently, the surface of the resin layer 25 is polished to expose the upper faces (the faces of the side opposite to the insulating layer 18) of the p-side metal pillar 23 and the n-side metal pillar 24 from the resin layer 25. Alternatively, after the fluorescent layer 28, which is described below, is formed, the surface of the resin layer 25 may be polished to expose each of the upper faces of the p-side metal pillar 23 and the n-side metal pillar 24.

Subsequently, the substrate 10 is removed. The substrate 10 is removed by, for example, laser lift-off. Specifically, laser light is irradiated from the backside of the substrate 10 toward the first semiconductor layer 11. The substrate 10 is transparent to the laser light, and the laser light has a wavelength in the absorption region of the first semiconductor layer 11.

When the laser light reaches the interface between the substrate 10 and the first semiconductor layer 11, the first semiconductor layer 11 proximal to the interface absorbs the energy of the laser light and decomposes. For example, in the case where the first semiconductor layer 11 is a metal nitride (for example, GaN), the first semiconductor layer 11 decomposes into gallium (Ga) and nitrogen gas. A micro gap is formed between the substrate 10 and the first semiconductor layer 11 by the decomposition reaction, and the substrate 10 and the first semiconductor layer 11 separate.

The irradiation of the laser light is performed over the entire wafer by performing multiply for each set region, and the substrate 10 is removed. The substrate 10 is removed from the first major surface 15a, and light extraction efficiency can be increased.

After removing the substrate 10, the first major surface 15a is cleaned, and the first major surface 15a is roughened to increase light extraction efficiency if necessary.

Subsequently, the fluorescent layer 28 (shown in FIG. 1) is formed on the first major surface 15a of the semiconductor layer 15. The fluorescent layer 28 is formed, for example, by coating a liquid resin (transparent with respect to the emitting light of the light emitting layer 12 and phosphor particles) in which phosphor particles are mixed by spin coating and then thermosetting.

After forming the fluorescent layer 28, dicing is performed along the separating trench 9 to singulate. At the dicing, the substrate 10 is already removed, in the separating trench 9, the semiconductor layer 15 does not exist and the insulating layer 18 which is a resin is filled, and the dicing is easy and the productivity can be improved. Furthermore, damage of the semiconductor layer 15 at the dicing can be avoided. Further, a structure is obtained after singulation in which the side faces of the semiconductor layer 15 is covered with the insulating layer 18 and protected.

The singulated semiconductor light emitting device may have a single-chip structure including one semiconductor layer (chip) 15 or a multi-chip structure including multiple semiconductor layers (chips) 15.

Because the processes described above up to the dicing are performed collectively in the wafer state, it is unnecessary to reconnect electrodes and perform packaging for each of the singulated semiconductor light emitting devices, and it is possible to drastically reduce production costs. The reconnecting the electrodes and the packaging are already complete in the singulated state. Also, inspections are possible at the wafer level. Therefore, the productivity can be increased. As a result, cost reductions are easy.

Figure 7A:
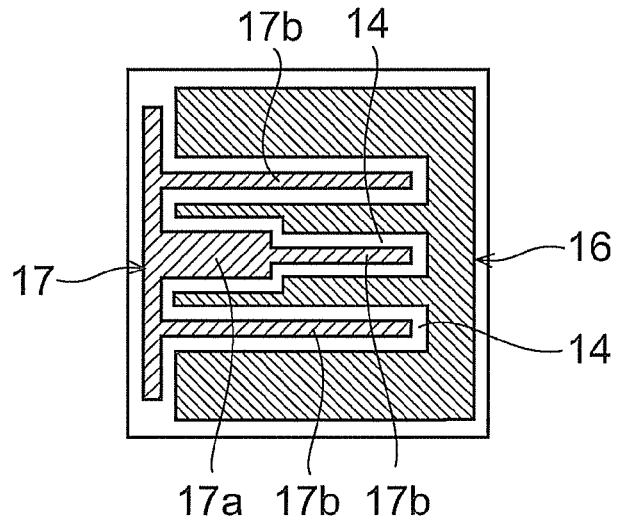
FIGS. 7A to 7C are schematic plan views illustrating another example of the configuration and layout of components provided on the second major surface side of the semiconductor light emitting device of the embodiment.
Figure 7B:
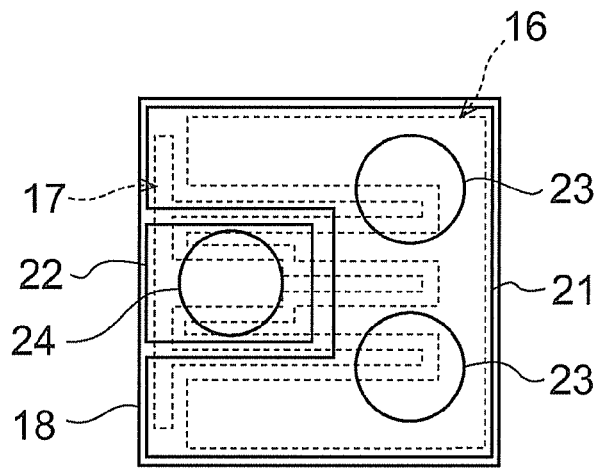
Figure 7C:
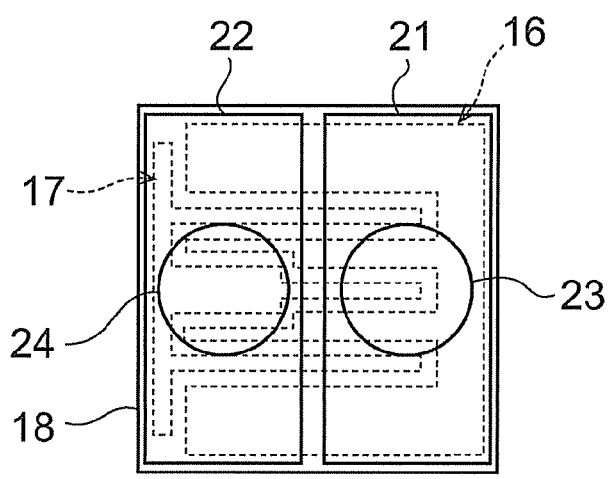

A planar shape of the chip is not limited to a rectangular shape. A square shape may be used as shown in FIGS. 7A to 7C. The configuration of the p-side metal pillar 23 and the n-side metal pillar 24 are not limited to circular columnar configurations. Prismatic configurations, columnar configurations having an elliptical section, etc. may be used.

The current density is relatively high in the portion proximal to the interface between the p-side electrode 16 and the n-side electrode 17 in planar view, and the current density decreases apart from the interface between them. Consequently, in the case where the chip area (the area of the light emitting region) is considerably large, it is favorable that a plurality of the second portions 17b which is elongated to the p-side electrode 16 and interposed in the p-side electrode 16 are formed as shown in FIG. 7A.

Consequently, the interface between the n-side electrode 17 and the p-side electrode 16 can be formed unbiasedly on the light emission surface on which the p-side electrode 16 extends, and more uniform current injection to the light emitting layer becomes possible. As a result, even if the chip area is considerably large, efficiency and the luminance can be increased.

FIG. 7B illustrates another specific example of a planar layout of the p-side interconnect layer 21 and the n-side interconnect layer 22. In FIG. 7B, the n-side interconnect layer 22 is formed in, for example, a rectangular shape and the p-side interconnect layer 21 is formed to enclose the three sides in a planar view. The surface area of the p-side interconnect layer 21 is greater than that of the n-side interconnect layer 22. Consequently, a heat radiating surface of the p-side, which has the greater amount of heat generation than that of the n-side, is larger, and radiativity of heat of the p-side can be enhanced.

On the p-side interconnect layer 21, a plurality of the p-side metal pillars 23 are provided. Thereby, a more lot of heat paths via the p-side metal pillars 23 are ensured, and radiativity of heat can be more enhanced. Further, the strength can be higher by the plurality of the p-side metal pillars 23.

As shown in FIG. 7C, it is a matter of course that a layout in which the mounting surface is nearly bisected between the p-side interconnect layer 21 and the n-side interconnect layer 22 is designed.

As illustrated in FIG. 7B, the layout in which the p-side interconnect layer 21 is greater than the n-side interconnect layer 22 is not limited to the electrodes design shown in FIG. 7A and applicable to the electrodes design shown in FIG. 2A, further to the electrodes design in FIGS. 8A to 9C and FIG. 11A which is described below. Because the p-side interconnect layer 21 and the n-side interconnect layer 22 are provided on the surface 18c of the insulating layer 18 which covers the electrodes 16 and 17, the configuration and the layout can be freely designed independently of the configuration and the layout of the electrodes 16 and 17.

FIGS. 8A to 9C illustrate other specific examples of the planar layout of the p-side electrode 16 and the n-side electrode 17.

Figure 8A:
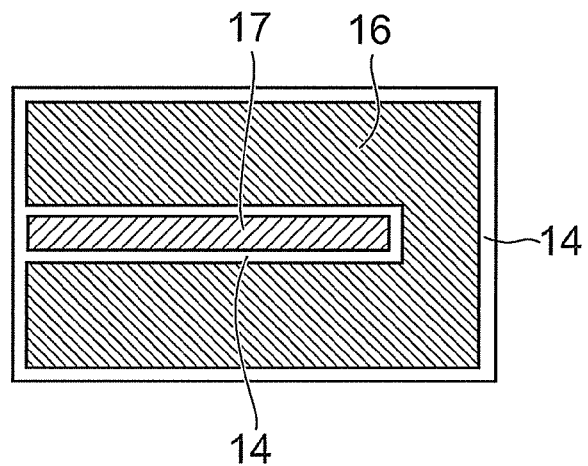
FIGS. 8A to 9C are schematic plan views illustrating still another example of the configuration and layout of components provided on the second major surface side of the semiconductor light emitting device of the embodiment.

In FIG. 8A, the n-side electrode 17 extends in an elongated shape in the longitudinal direction of the p-side electrode 16.

The n-side electrode 17 extends from a lengthwise end of the p-side electrode 16 over half a lengthwise length of the p-side electrode 16.

Figure 8B:
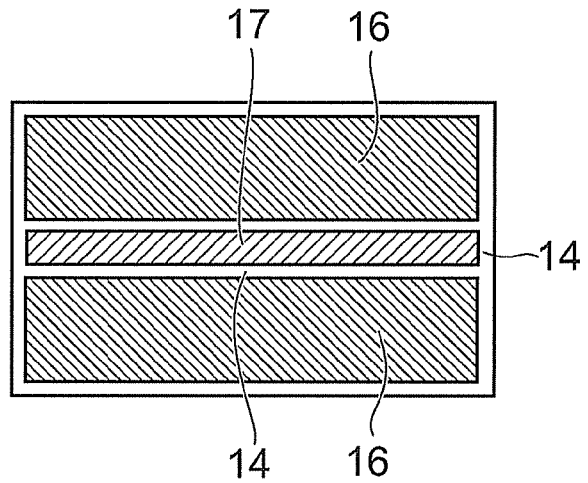

In FIG. 8B, the p-side electrode 16 is divided along a widthwise direction by the n-side electrode 17 which extends in the longitudinal direction of the p-side electrode 16.

Figure 8C:
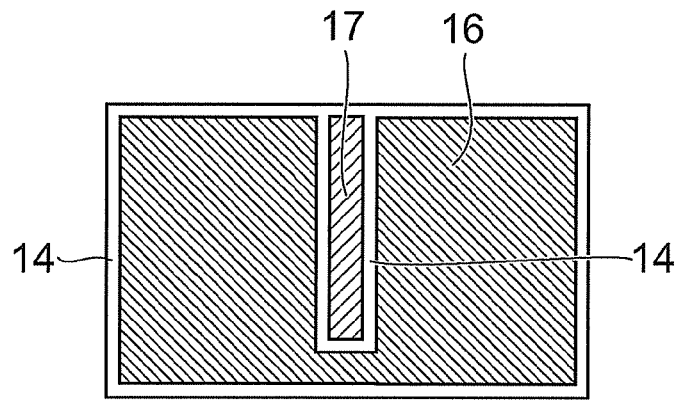

In FIG. 8C, the n-side electrode 17 extends in the widthwise direction of the p-side electrode 16.

Figure 9A:
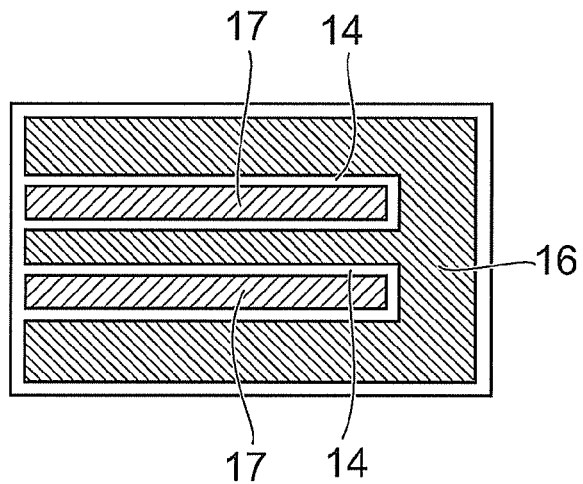
Figure 9B:
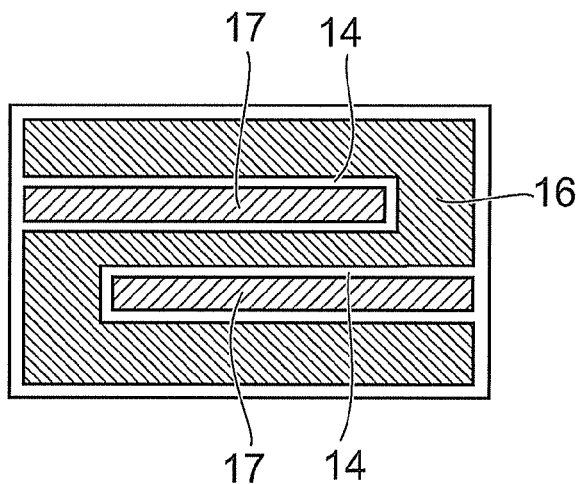

FIGS. 9A and 9B illustrate specific examples that a plurality of elongated n-side electrodes 17 (shown in the case of two) are provided. In FIG. 9A, the p-side electrode 16 is formed in a comb-shape in which the n-side electrodes 17 are interposed. In FIG. 9B, the p-side electrode 16 is formed in a zigzag with interposing the n-side electrodes 17.

The plurality of the n-side electrodes 17 are not limited to be parallel to each other, or may not be parallel. The n-side electrodes 17 are not limited to be parallel to a lengthwise direction or a widthwise direction of the p-side electrode 16, or may be tapered.

Figure 9C:
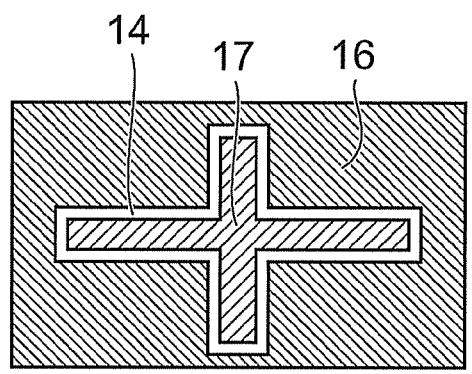

The plurality of the n-side electrodes 17 may intersect each other as shown in FIG. 9C. In FIG. 9C, two of the n-side electrodes 17 intersect at right angles, but may intersect obliquely.

In each of the specific examples in FIG. 8A to 9C, the n-side electrode 17 is interposed in the p-side electrode 16. Thereby, the length of the interface where the p-side electrode 16 and the n-side electrode 17 face each other in the planar view can be increased. As a result, a variation of a current density along the surface of the light emitting layer 12 and the luminance can be reduced and a highly efficient light emitting device can be realized.

Figure 10:
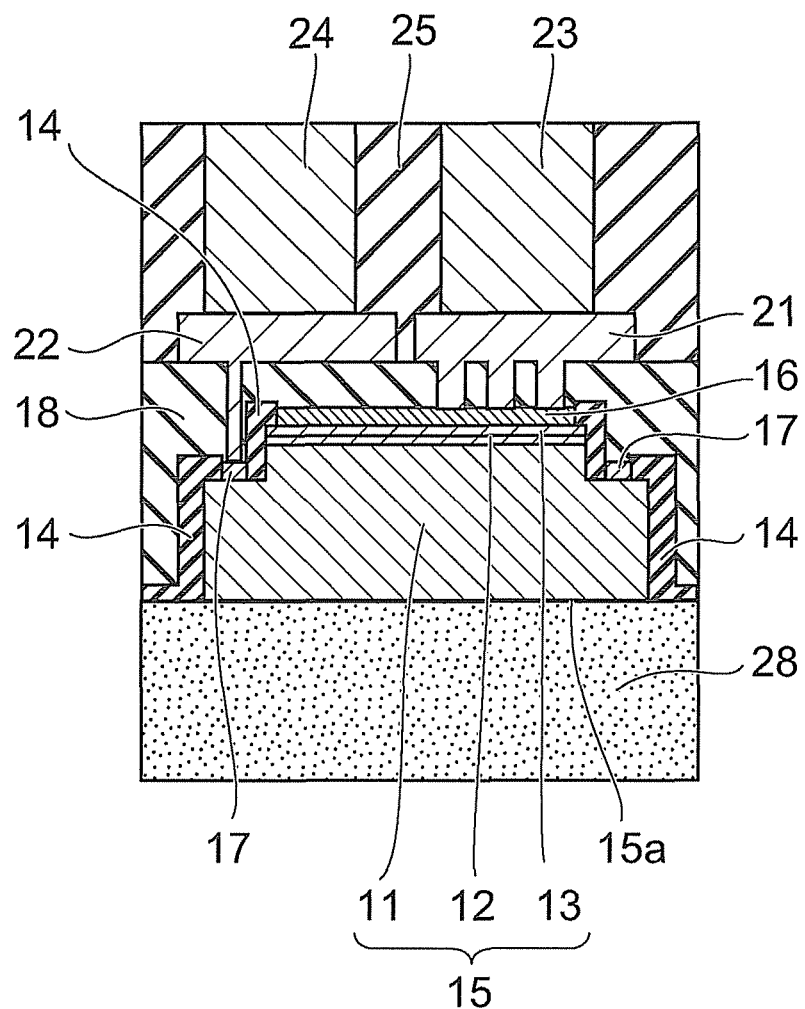
FIG. 10 is a schematic cross-sectional view of a semiconductor light emitting device of another embodiment.

FIG. 10 is a schematic cross-sectional view of a semiconductor light emitting device of another embodiment.

Figure 11A:
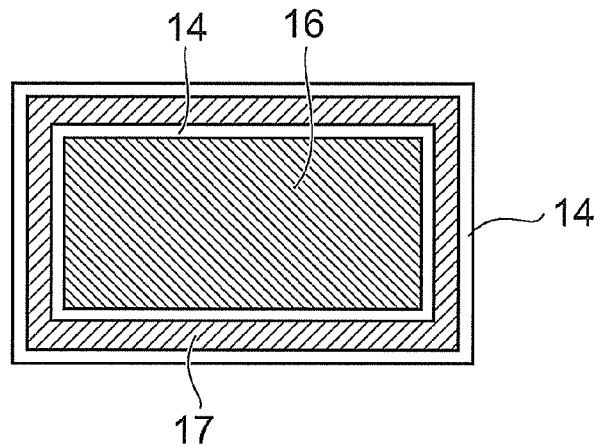
FIGS. 11A and 11B are schematic plan views illustrating the configuration and layout of components provided on a second major surface side of the semiconductor light emitting device of the another embodiment.

FIG. 11A is a schematic plan view illustrating the configuration and a layout of the p-side electrode 16 and the n-side electrode 17 in the configuration shown in FIG. 10.

Figure 11B:
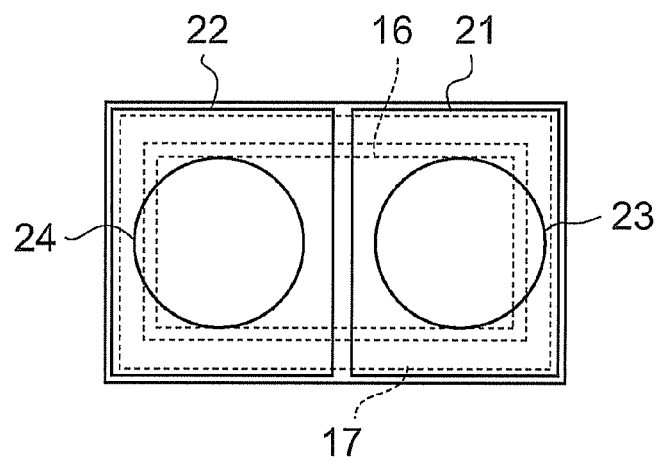

FIG. 11B is a schematic plan view illustrating the configuration and the layout of the p-side interconnect layer 21, the n-side interconnect layer 22, the p-side metal pillar 23 and the n-side metal pillar 24 in the configuration shown in FIG. 10.

The n-side electrode 17 formed in linear continuously encloses the circumferences of the p-side electrode 16 in a planar view. Thereby, the length of the interface between the p-side electrode 16 and the n-side electrode 17 can be ensured, and the current injection unbiased with respect to the light emission surface and more uniformed becomes possible. At a result, efficiency and the luminance can be further improved. The enhancement of the length of the interface between the p-side electrode 16 and the n-side electrode 17 causes suppression of local concentration of electric field and increase of the reliability.

The p-side electrode 16 is formed to extend in, for example, a rectangular shape or a square shape on the light emitting region. In this embodiment, because the layout in which the n-side electrode 17 does not protrudes to the p-side electrode 16 side, the surface area of the p-side electrode 16 can be increased. Consequently, the light emitting region can be enlarged and the luminance can be increased.

Figure 12:
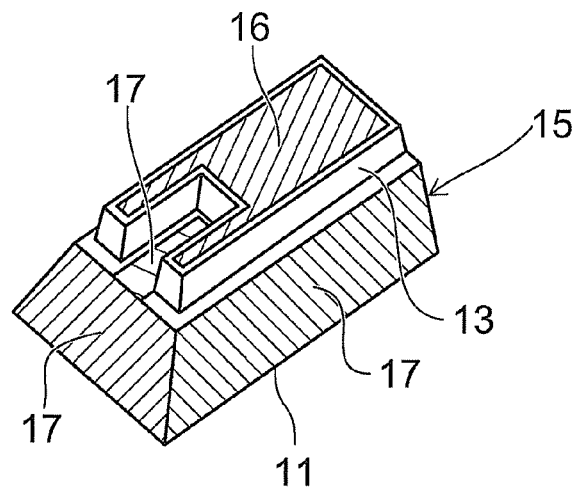
FIG. 12 is a schematic perspective view illustrating an example in which an electrode is provided on a side face of a semiconductor layer of the semiconductor light emitting device of the embodiment.

As shown in FIG. 12, the n-side electrode 17 may be formed on the side face of the first semiconductor layer 11 in addition to the second major surface. The n-side electrode 17 formed on the side face of the first semiconductor layer 11 continuously encloses the side face of the first semiconductor layer 11.

Because the n-side electrode 17 is also formed on the side face, the surface area of the n-side electrode 17 can be increased. The local concentration of electric field can be suppressed, and the reliability can be increased.

The n-side electrode 17 is made of a metal having light-shielding properties to the light emitted from the light emitting layer 12. Accordingly, a structure is provided in which the side face of the first semiconductor layer 11 is covered with a light-shielding film. Therefore, light leakage from the side face can be prevented, and uneven colors can be suppressed. Further, the metal forming the n-side electrode 17 has reflection for the light emitted from the light emitting layer 12. Therefore, the amount of the light reflected from the side face of the first semiconductor 11 and extracted from the first major surface 15a side can be increased, and the luminance can be increased.

Red fluorescent layers, yellow fluorescent layers, green fluorescent layers and blue fluorescent layers, which will be illustrated below, can be used as the fluorescent layer 28.

The red fluorescent layer may contain, for example, a nitride-based phosphor of $CaAlSiN_3:Eu$ or a SiAlON-based phosphor.

In the case where a SiAlON-based phosphor is used, it may be used $$(M_{1-x}R_x)_{a1}AlSi_{b1}O_{c1}N_{d1} \qquad \text{Compositional Formula (1)}$$

where M is at least one type of metal element excluding Si and Al, and it may be desirable for M to be at least one selected from Ca and Sr, R is a light emission center element, and it may be desirable for R to be Eu, and x, a1, b1, c1, and d1 satisfy the relationships $0<x\leq1$, $0.6<a1<0.95$, $2<b1<3.9$, $0.25<c1<0.45$, and $4<d1<5.7$.

By using the SiAlON-based phosphor of Compositional Formula (1), the temperature characteristics of the wavelength conversion efficiency can be improved, and the efficiency in the high current density region can be improved further.

The yellow fluorescent layer may contain, for example, a silicate-based phosphor of $(Sr, Ca, Ba)_2SiO_4:Eu$.

The green fluorescent layer may contain, for example, a halophosphate-based phosphor of $(Ba, Ca, Mg)_{10}(PO_4)_6.Cl_2:Eu$ or a SiAlON-based phosphor.

In the case where a SiAlON-based phosphor is used, it may be used $$(M_{1-x}R_x)_{a2}AlSi_{b2}O_{c2}N_{d2} \qquad \text{Compositional Formula (2)}$$

where M is at least one type of metal element excluding Si and Al, and it may be desirable for M to be at least one selected from Ca and Sr, R is a light emission center element, and it may be desirable for R to be Eu, and x, a2, b2, c2, and d2 satisfy the relationships $0<x\leq1$, $0.93<a2<1.3$, $4.0<b2<5.8$, $0.6<c2<1$, and $6<d2<11$.

By using the SiAlON-based phosphor of Compositional Formula (2), the temperature characteristics of the wavelength conversion efficiency can be improved, and the efficiency in the high current density region can be improved further.

A blue fluorescent layer may contain, for example, an oxide-based phosphor of $BaMgAl_{10}O_{17}:Eu$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
   a semiconductor layer including a first major surface, a second major surface opposite to the first major surface, and a light emitting layer, the semiconductor layer not including a substrate on the first major surface side;
   a first electrode provided on a region including the light emitting layer on the second major surface;
   a second electrode provided on the second major surface and at least partially interposed in the first electrode in a planar view;
   a first insulating layer provided on the second major surface side of the semiconductor layer, and covering a side surface continuing from the first major surface of the semiconductor layer;
   a first interconnect layer provided on the first insulating layer on a side opposite to the semiconductor layer, the first interconnect layer provided in a first opening formed in the first insulating layer reaching the first electrode, and the first interconnect layer connected to the first electrode;
   a second interconnect layer provided on the first insulating layer on the side opposite to the semiconductor layer, the second interconnect layer provided in a second opening formed in the first insulating layer reaching the second electrode, and the second interconnect layer connected to the second electrode;
   a first metal pillar provided on a face of the first interconnect layer on a side opposite to the first electrode;
   a second metal pillar provided on a face of the second interconnect layer on a side opposite to the second electrode;
   a second insulating layer provided between a side face of the first metal pillar and a side face of the second metal pillar, and
   a fluorescent layer provided on the first major surface side without a substrate between the first major surface and the fluorescent layer.

2. The device of claim 1, wherein a surface area of the first electrode is greater than a surface area of the second electrode.

3. The device of claim 1, wherein the second electrode is further provided to enclose a periphery of the first electrode in the planar view.

4. The device of claim 1, wherein the second electrode includes a relatively wide portion and a narrow portion, the second opening is provided to reach the wide portion, and the second interconnect layer is connected to the wide portion.

5. The device of claim 1, wherein number of the first openings is larger than number of the second openings, and a connecting area between the first interconnect layer and the first electrode is greater than a connecting area between the second interconnect layer and the second electrode.

6. The device of claim 1, wherein a surface area of the first interconnect layer on the first insulating layer is greater than a surface area of the second interconnect layer on the first insulating layer.

7. The device of claim 6, wherein a plurality of the first metal pillars are provided on the first interconnect layer.

8. The device of claim 1, wherein the semiconductor layer includes:
   a non-light emitting region not having the light emitting layer; and
   a light emitting region being provided to protrude more than the non-light emitting region, and the light emitting region having the light emitting layer, the first electrode is provided on a surface of the light emitting region, and the second electrode is provided on a surface of the non-light emitting region.

9. The device of claim 1, wherein the semiconductor layer has a rectangular shape in the planar view, and the interposed portion of the second electrode is extended in a longitudinal direction.

10. The device of claim 1, wherein a contact area between the second interconnect layer and the second metal pillar is greater than a contact area between the second interconnect layer and the second electrode.

11. The device of claim 1, wherein a contact area between the first interconnect layer and the first metal pillar is greater than a contact area between the first interconnect layer and the first electrode.

12. The device of claim 1, wherein a portion of the second interconnect layer extends to a position facing the light emitting layer on the first insulating layer.

13. The device of claim 1, wherein a surface area of the second interconnect layer on a side opposite to the second electrode is greater than a surface area of the second interconnect layer on a side connecting the second electrode.

14. The device of claim 1, wherein a thickness of each of the first metal pillar and the second metal pillar is thicker than a thickness of a stacked body including the semiconductor layer, the first electrode, the second electrode, and the first insulating layer.

15. A semiconductor light emitting device, comprising:
   a semiconductor layer including a first major surface, a second major surface opposite to the first major surface, and a light emitting layer, the semiconductor layer not including a substrate on the first major surface side;
   a first electrode provided on a region including the light emitting layer on the second major surface;
   a second electrode provided on the second major surface, the second electrode enclosing the first electrode in a planar view;
   a first insulating layer provided on the second major surface side of the semiconductor layer, and covering a side surface continuing from the first major surface of the semiconductor layer;
   a first interconnect layer provided on the first insulating layer on a side opposite to the semiconductor layer, the first interconnect layer provided in a first opening formed in the first insulating layer reaching the first electrode, and the first interconnect layer connected to the first electrode;
   a second interconnect layer provided on the first insulating layer on the side opposite to the semiconductor layer, the second interconnect layer provided in a second opening formed in the first insulating layer reaching the second electrode, and the second interconnect layer connected to the second electrode;
   a first metal pillar provided on a face of the first interconnect layer on a side opposite to the first electrode;
   a second metal pillar provided on a face of the second interconnect layer on a side opposite to the second electrode;
   a second insulating layer provided between a side face of the first metal pillar and a side face of the second metal pillar, and
   a fluorescent layer provided on the first major surface side without a substrate between the first major surface and the fluorescent layer.

16. The device of claim 15, wherein a surface area of the first electrode is greater than a surface area of the second electrode.

17. The device of claim 15, wherein number of the first openings is larger than number of the second openings, and a connecting area between the first interconnect layer and the first electrode is greater than a connecting area between the second interconnect layer and the second electrode.

18. The device of claim 15, wherein the semiconductor layer includes:
- a non-light emitting region not having the light emitting layer; and
- a light emitting region being provided to protrude more than the non-light emitting region, and the light emitting region having the light emitting layer, the first electrode is provided on a surface of the light emitting region, and the second electrode is provided on a surface of the non-light emitting region.

19. The device of claim 18, wherein a planar area of the light emitting layer is greater than a planar area of the non-light emitting layer.

20. The device of claim 15, wherein a surface area of the second interconnect layer on a side opposite to the second electrode is greater than a surface area of the second interconnect layer on a side connecting the second electrode.

* * * * *